(12) United States Patent
Grossi et al.

(10) Patent No.: US 7,566,610 B2
(45) Date of Patent: Jul. 28, 2009

(54) PROCESS FOR MANUFACTURING INTEGRATED RESISTIVE ELEMENTS WITH SILICIDATION PROTECTION

(76) Inventors: Alessandro Grossi, Via Lario, 8, Milan (IT) 20159; Roberto Bez, Via Vespri Siciliani, 2, Milan (IT) 20146; Giorgio Servalli, Via Cabina 14/P, Ciserano (IT) 24040

( * ) Notice: Subject to any disclaimer, the term of this patent is extended or adjusted under 35 U.S.C. 154(b) by 361 days.

(21) Appl. No.: 11/343,593

(22) Filed: Jan. 30, 2006

(65) Prior Publication Data
US 2006/0141730 A1 Jun. 29, 2006

Related U.S. Application Data

(62) Division of application No. 10/672,293, filed on Sep. 26, 2003, now Pat. No. 7,176,553.

(30) Foreign Application Priority Data
Sep. 30, 2002 (EP) .................. 02425586

(51) Int. Cl.
*H01L 21/8234* (2006.01)
(52) U.S. Cl. .............. 438/238; 438/382; 438/229; 257/536; 257/538
(58) Field of Classification Search ............ 257/334, 257/E21.634, E21.636, 536–538; 438/303, 438/592, 633, 634, 665
See application file for complete search history.

(56) References Cited

U.S. PATENT DOCUMENTS

| | | | |
|---|---|---|---|
| 4,464,212 A * | 8/1984 | Bhatia et al. | 438/384 |
| 5,439,846 A | 8/1995 | Nguyen et al. | |
| 5,565,698 A | 10/1996 | Obermeier | |
| 5,691,555 A | 11/1997 | Zambrano et al. | |
| 6,027,965 A * | 2/2000 | Stucchi et al. | 438/238 |
| 6,051,440 A * | 4/2000 | Chan et al. | 438/2 |
| 6,051,864 A | 4/2000 | Hodges et al. | |
| 6,103,622 A | 8/2000 | Huang | |
| 6,143,613 A | 11/2000 | Lin | |
| 6,146,994 A * | 11/2000 | Hwang | 438/633 |
| 6,198,128 B1 | 3/2001 | Asakura et al. | |
| 6,700,474 B1 | 3/2004 | Leibiger | |
| 2003/0006433 A1 | 1/2003 | Funayama et al. | |

FOREIGN PATENT DOCUMENTS

EP 0 975 021 A1 3/2003

OTHER PUBLICATIONS

European Search Report, EP 02 425586, dated Mar. 10, 2003.

* cited by examiner

*Primary Examiner*—N Drew Richards
*Assistant Examiner*—Mamadou Diallo
(74) *Attorney, Agent, or Firm*—Schwabe Williamson & Wyatt

(57) ABSTRACT

In a process for the fabrication of integrated resistive elements with protection from silicidation, at least one active area (15) is delimited in a semiconductor wafer (10). At least one resistive region (21) having a predetermined resistivity is then formed in the active area (15). Prior to forming the resistive region (21), however, a delimitation structure (20) for delimiting the resistive region (21) is obtained on top of the active area (15). Subsequently, protective elements (25) are obtained which extend within the delimitation structure (20) and coat the resistive region (21).

28 Claims, 5 Drawing Sheets

PROCESS FOR MANUFACTURING INTEGRATED RESISTIVE ELEMENTS WITH SILICIDATION PROTECTION

PRIORITY CLAIM

The present application is a divisional of U.S. application for patent Ser. No. 10/672,293, filed Sep. 26, 2003, which claims priority from European Application for Patent No. 02425586.1 filed Sep. 30, 2002, the disclosures of both of which are hereby incorporated by reference.

BACKGROUND OF THE INVENTION

1. Technical Field of the Invention

The present invention relates to a process for manufacturing integrated resistive elements with self-aligned silicidation protection.

2. Description of Related Art

As is known, numerous processes for the fabrication of integrated electronic devices comprise steps of so-called self-aligned silicidation or salicidation, the main purpose of which is to increase the conductivity of some structures, such as polysilicon connection lines or active areas in which junctions are made. In brief, silicidation is generally carried out after the usual steps of ion implantation and diffusion, which are normally employed for fabricating integrated semiconductor circuits. With reference for greater clarity to FIGS. 1 to 3, a semiconductor wafer 1, for example, made of monocrystalline silicon, comprises conductive active areas 2, isolated by shallow-trench isolation (STI) structures 3 or, alternatively, by isolation structures obtained with local-oxidation (LOCOS) techniques. In practice, the isolation structures 3 comprise trenches of predetermined depth filled with silicon dioxide. In the active areas 2, elements are previously made (here not illustrated in detail), the conductivity of which is to be optimized. Initially, a conductive layer 5 of a metal such as titanium or cobalt is deposited upon the wafer 1, so as to cover completely both the active areas 2 and the isolation structures 3. The wafer 1 is then heated. In this step, the metal reacts with the underlying silicon, forming titanium-silicide or cobalt-silicide regions 6, whereas it does not react with the silicon oxide of the isolation structures 3. The metal of the conductive layer 5' is then selectively etched and removed, whilst the metal-silicide regions 6 remain intact. In practice, therefore, the exposed conductive portions of monocrystalline-silicon or polycrystalline-silicon remain covered by the regions 6. Silicidation is clearly advantageous, because the silicides thus obtained typically have resistivity values of an order of magnitude smaller than even heavily doped silicon and polysilicon. The process is moreover self-aligned, since the formation of the regions 6 is determined by the surface conformation of the wafer 1, and hence, for the definition of silicidized structures, the use of masks is not required.

There are, however, electrical components which are not compatible with silicidation and thus require special solutions to be integrated in the active areas. In particular, resistors with high specific resistance are normally made of appropriately doped silicon and must therefore be altogether protected during the silicidation step; otherwise, in fact, they would be substantially short-circuited and would loose their function.

Known processes for fabricating resistors in active areas, in which a silicidation step is carried out, envisage the use of protective structures which cover the resistors themselves, preventing contact between the deposited metal and uncovered silicon areas. The addition of a structure for protection from silicidation, which is typically obtained via deposition of dielectric materials, such as silicon dioxide, silicon oxynitride or silicon nitride, is, however, disadvantageous because it increases both the complexity and the overall cost of the process. In fact, the fabrication of a protective structure involves steps of deposition, definition by a photolithographic process to form a mask, etching, and, after silicidation, possible removal of the dielectric from the semiconductor wafer. In practice, all these steps are exclusively dedicated to the protection from silicidation and cannot be shared for fabrication of other integrated components.

There is accordingly a need to provide a process for the fabrication of integrated resistors which is free from the drawbacks described above.

SUMMARY OF THE INVENTION

The present invention is directed to a process for the fabrication of integrated resistive elements which are protected from silicidation. The present invention is further a semiconductor wafer and/or an integrated device which are manufactured from the process.

In one embodiment of the process of the present invention, an integrated resistive element is fabricated with protection from silicidation by delimiting at least one active area in a semiconductor wafer. Within that active area, at least one resistive region having a pre-set resistivity is formed. On top of the active area, a delimitation structure which delimits the resistive region is formed. Protective elements, which extend within said delimitation structure and cover said resistive region, are then formed. Silicidation may then occur safely without endangering the conductivity of the resistive region.

An embodiment of the present invention further comprises a semiconductor wafer upon which is formed at least one active area and at least one resistor having a resistive region located within the active area. A delimitation structure is provided on top of the active area for delimiting the resistive region. Elements which protect against silicidation are used within the delimitation structure to cover the resistive region.

Yet another embodiment of the present invention comprises an integrated device formed on a semiconductor body housing at least a one active area and at least one resistor. The resistor has a resistive region obtained within the active area. A delimitation structure set on top of said active area delimits the resistive region.

In accordance with another embodiment, a process for integrated circuit fabrication comprises defining an active area in a semiconductor substrate, forming a resistive region having a pre-set resistivity in the active area, forming a polysilicon structure which delimits the resistive region, depositing a protective layer over the polysilicon structure and resistive region, etching the protective layer back to expose the polysilicon structure without uncovering the resistive region, and siliciding the exposed polysilicon structure without affecting the pre-set resistivity in the active area.

In accordance with another embodiment, a process for integrated circuit fabrication comprises defining a non-transistor active area in a semiconductor substrate, forming a resistive region having a pre-set resistivity in the active area, forming a non-gate associated polysilicon structure which delimits the resistive region, depositing a protective layer over the polysilicon structure and resistive region, etching the protective layer back to expose the polysilicon structure without uncovering the resistive region, and siliciding the exposed polysilicon structure without affecting the pre-set resistivity in the active area.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figures 1, 2:
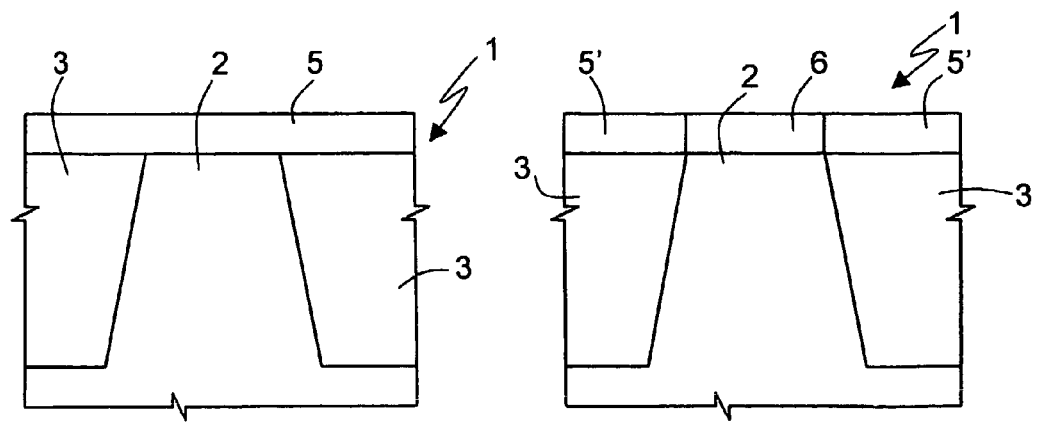
FIGS. 1 to 3 are cross-sectional views through a semiconductor wafer in successive fabrication steps according to a known process.
Figure 3:
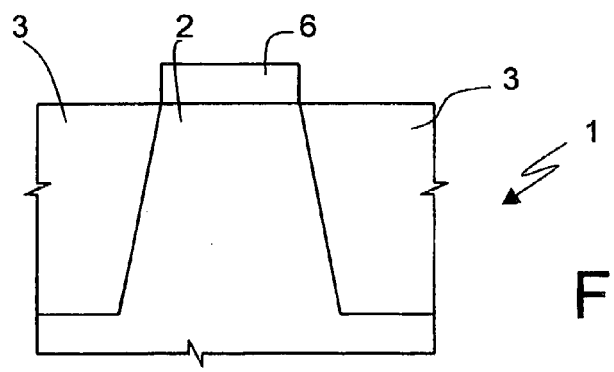
Figure 17:
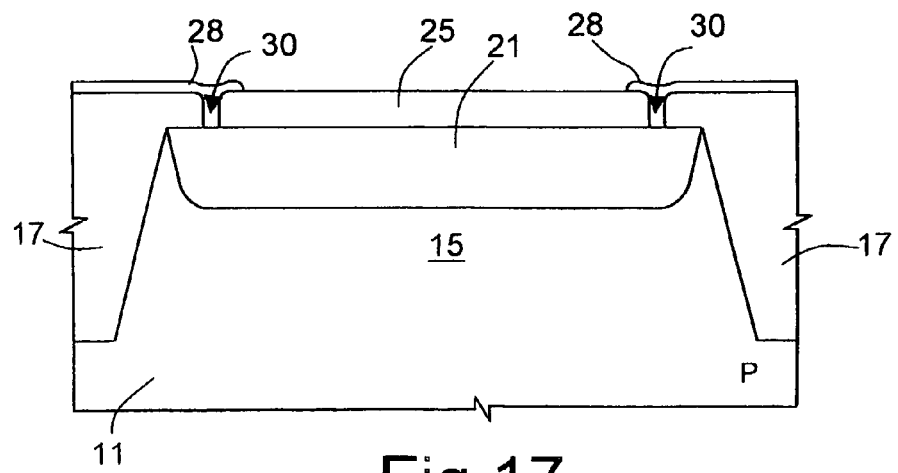
FIG. 17 is a cross-sectional view of the wafer of FIG. 16, taken along the line XVII-XVII of FIG. 16.
Figure 4:
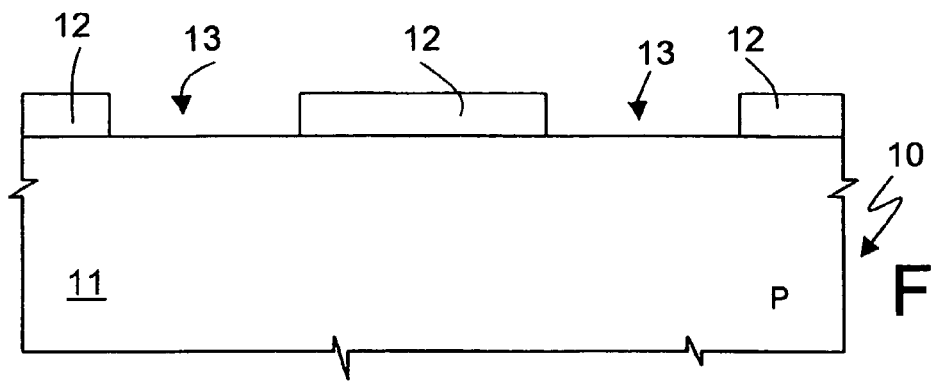
FIGS. 4 to 8 are cross-sectional views through a semiconductor wafer in successive fabrication steps of a process according to the present invention.
Figure 5:
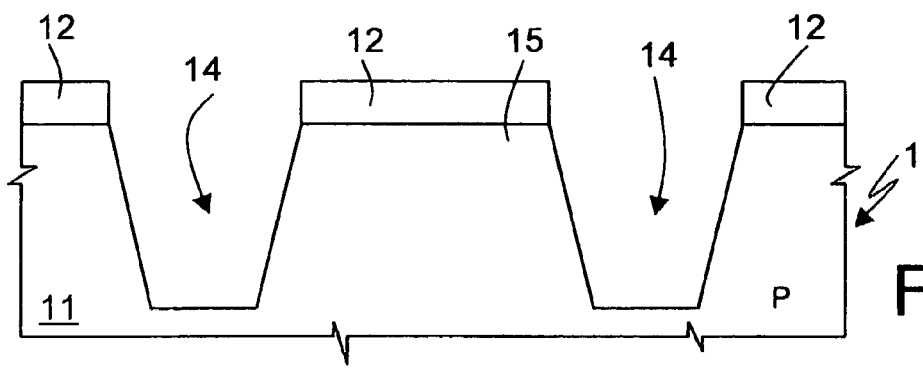

With reference to FIGS. 4 to 17, a semiconductor wafer 10, preferably of silicon, has a substrate 11, for example, of a P type. Initially, on the wafer 10 a silicon-nitride mask 12 is formed, having openings 13. Using the mask 12, the substrate 11 of the wafer 10 is etched and trenches 14, which delimit an active area 15, are opened (FIG. 5).

Figure 6:
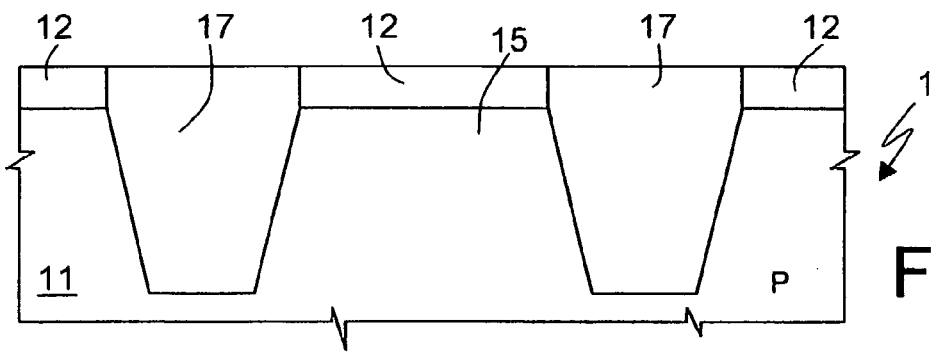
Figure 7:
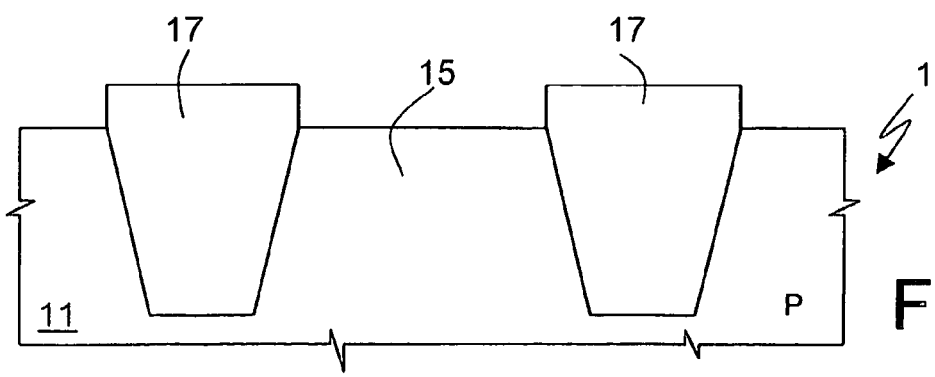

After a step of thermal oxidation, in which the profile of the trenches 14 is optimized, the trenches 14 themselves are filled with dielectric material, here silicon dioxide. The wafer 1 is then planarized by means of the chemical-mechanical polishing (CMP). In particular, the CMP treatment is stopped when the mask 12 is reached. At this point, in practice, the active area 15 is delimited by a trench-isolation structure 17, as shown in FIG. 6. The silicon-nitride mask 12 is then removed (FIG. 7).

Figure 8:
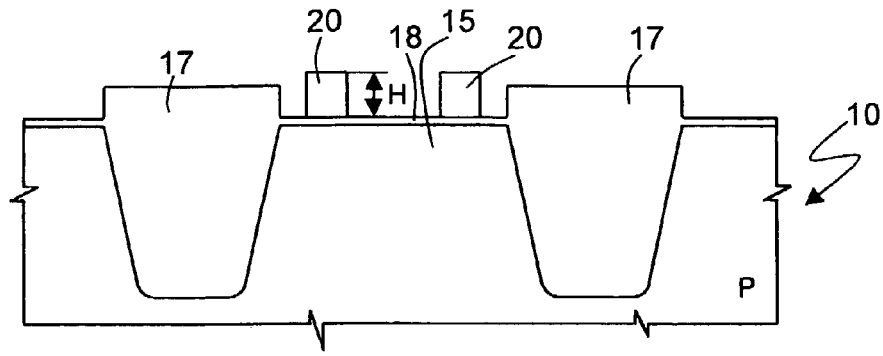
Figures 9A, 9B:
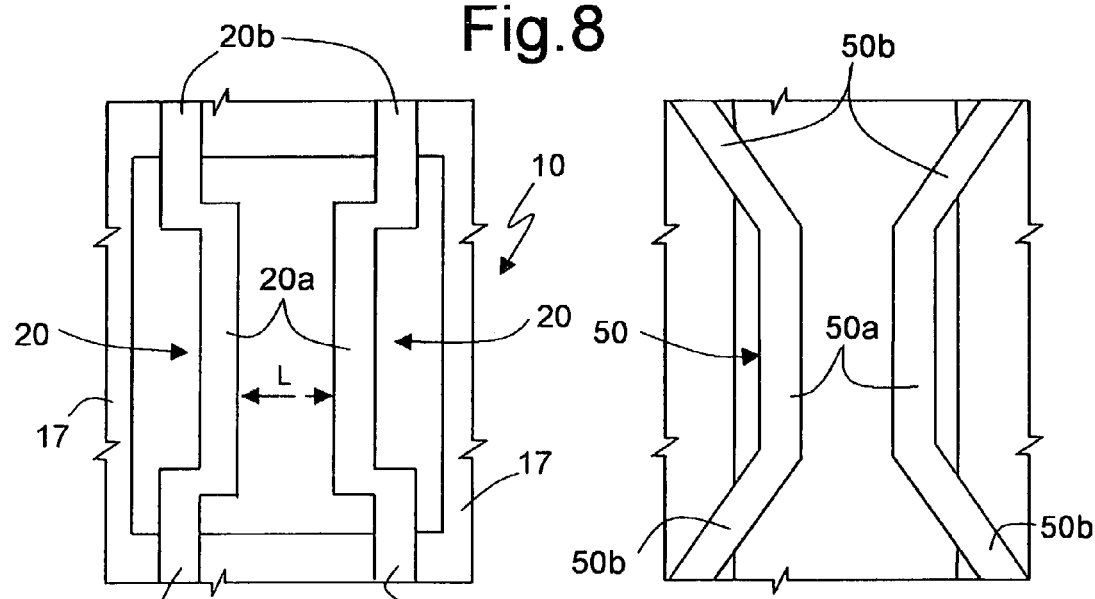
FIG. 9a is a top plan view of the wafer of FIG. 8.
FIG. 9b is a top plan view of the wafer of FIG. 8, according to a variant of the present process.
Figure 10:
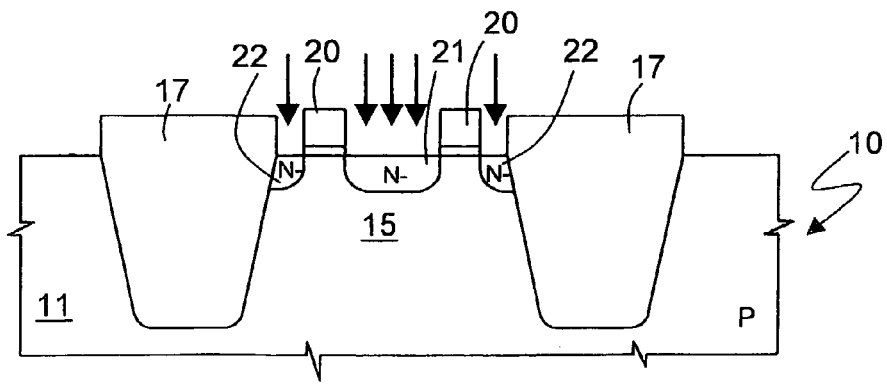
FIGS. 10 to 15 are cross-sectional views through the wafer of FIG. 9a in successive fabrication steps.

With reference to FIGS. 8 and 9a, a thin oxide layer 18, having a thickness of a few nanometers, is grown above the active area 15, and subsequently a pair of mutually symmetrical polysilicon delimiters 20 are formed. In particular, a polysilicon layer 20', represented in FIG. 8 by a dashed line, is formed on the wafer 10 and subsequently defined so as to form the delimiters 20. Preferably, the polysilicon layer 20' coats the entire wafer 1 and is used also for fabricating other integrated components (not illustrated here) such as, for example, MOS transistors or memory cells either of a volatile type or of a non-volatile type. The delimiters 20 have a height H, extend parallel to one another for respective portions 20a facing each other, at a predetermined distance L apart, and then diverge at their respective ends 20b, following a broken polygonal line. Preferably, the distance L is approximately twice the height H of the delimiters 20. Alternatively (FIG. 9b), delimiters 50 have ends 50b forming predetermined angles with respective central portions 50a. The oxide layer 18 is then removed outside the delimiters 20.

There is then performed an ion implantation of a dopant species of a type opposite to that of the substrate. In the case of a P substrate (here illustrated) an N-type dopant is used, for example, phosphorus. The implantation process is followed by a thermal process of activation and diffusion. In practice, the delimiters 20 are used as a mask for ion implantation. In this way, within the active area 15, N-type conductive wells are formed. In greater detail, in a portion of the active area 15 between the delimiters 20 a resistor 21 is made, while peripheral wells 22 are formed laterally. The resistor 21 has a width equal to the distance L between the delimiters 20 and is substantially as long as the portions 20a set facing one another of the delimiters 20 themselves. Furthermore, the resistivity of the resistor 21 is determined by the density of the dopants implanted after the diffusion process (for example, between $10^{16}$ and $10^{18}$ atoms/cm$^3$.

Figure 11:
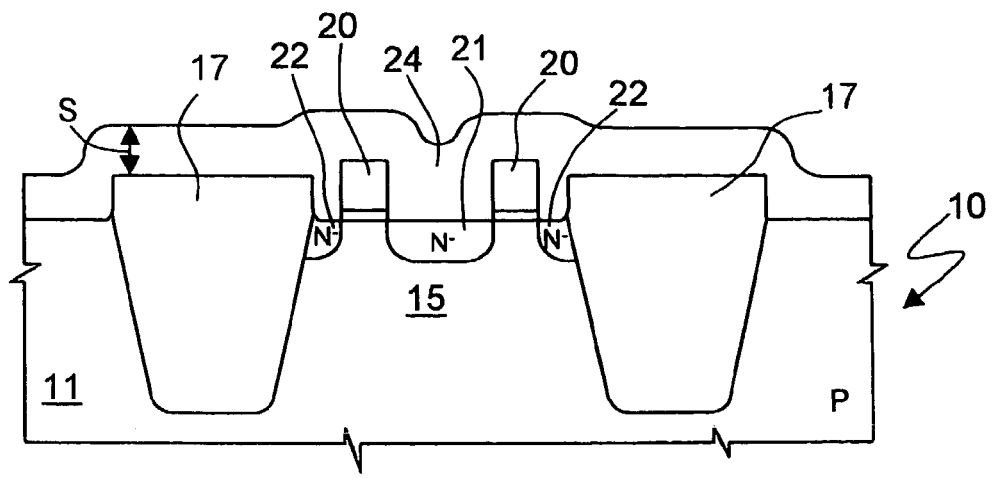

Next, the wafer 10 is entirely coated with a deposited oxide layer 24 (FIG. 11). Alternatively, a different dielectric material may be deposited, such as, for instance, silicon nitride or silicon oxynitride. The deposited oxide layer 24 presents good characteristics of conformity and preferably a thickness S of not less than one half of the distance L that separates the delimiters 20 from one another. In effect, the thickness of the deposited oxide layer 24 is perfectly uniform but is larger in the proximity of differences in levels, such as, for example, around the delimiters 20, and is smaller where the surface of the wafer 10 is flat (in particular, above the delimiters 20).

Figure 12:
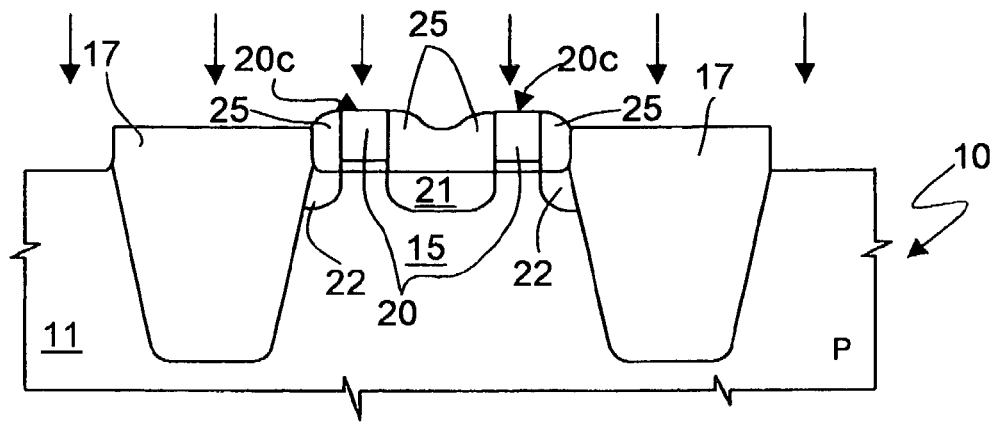
Figure 13:
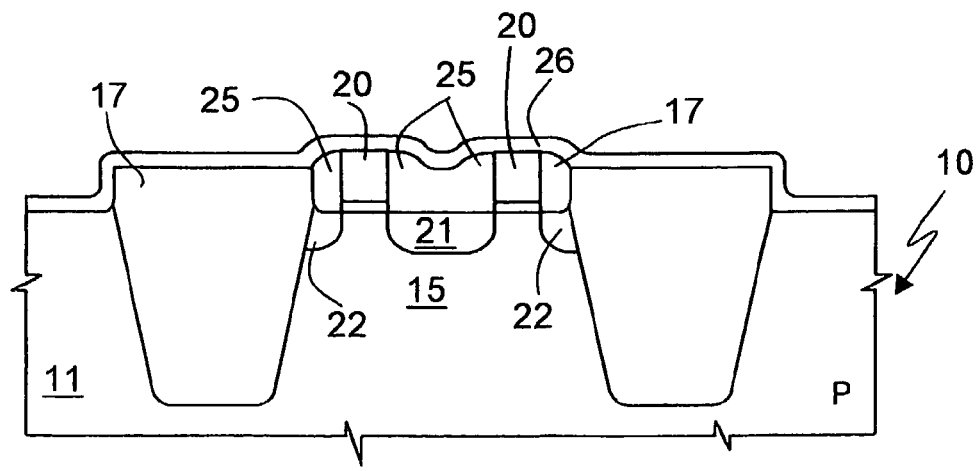
Figure 14:
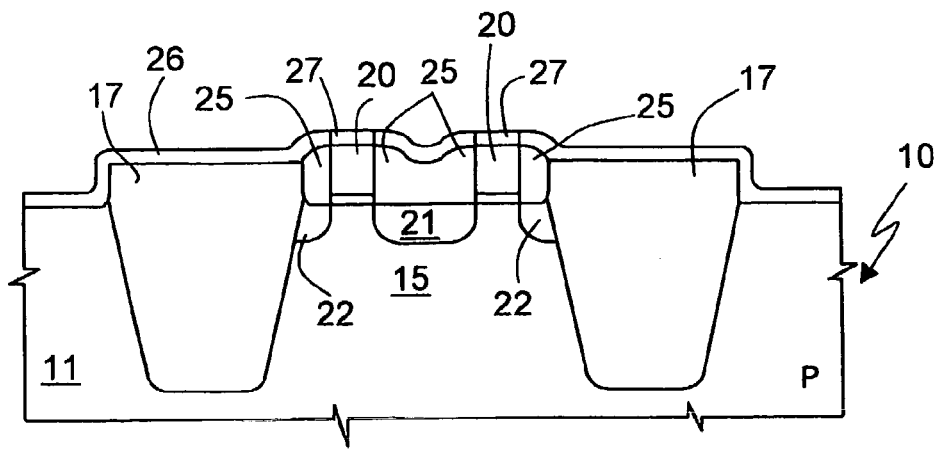
Figure 15:
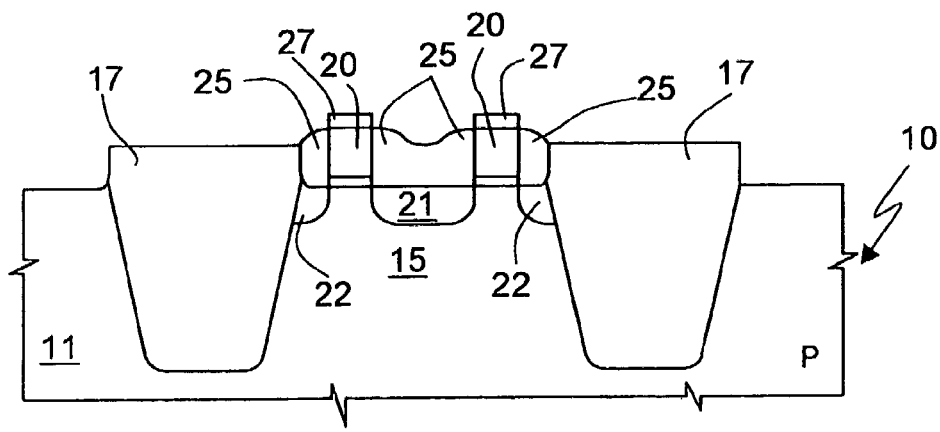
Figure 16:
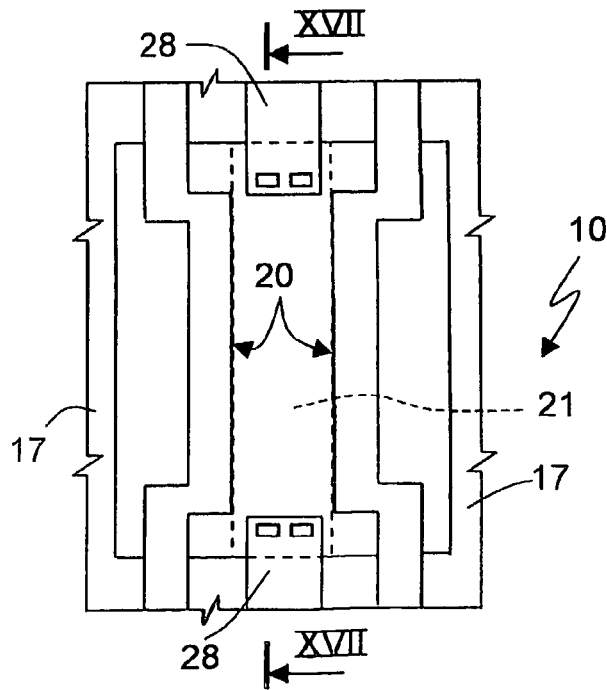
FIG. 16 is a top plan view of the wafer of FIG. 15.

As is illustrated in FIG. 12, the deposited oxide layer 24 is then etched in a markedly anisotropic manner for a controlled time interval (vertical etch). In greater detail, the etch is conducted so as to remove uniformly a silicon-oxide layer that is substantially equal to the thickness S deposited previously. In this way, the deposited oxide layer 24 is completely removed from the smoothed portions of the wafer 10. In particular, the surfaces 20c of the delimiters 20 are freed. In the proximity of the differences of level, instead, the silicon dioxide is not completely removed: on the sides of the delimiters 20, both inside and outside, residual portions of the deposited oxide layer 24 remain, which form elements of protection or spacers 25. In addition, the initial thickness S of the deposited silicon-dioxide layer 24 and the ratio between the height H of the delimiters 20 and the distance L between them are such that the spacers 25 inside the delimiters 20 themselves join up and completely cover the resistor 21.

Ion implantations, which are necessary for making active components of devices (not illustrated) integrated in the wafer 10, are then carried out. In this step, the resistor 21 is protected by the spacers 25 inside the delimiters and hence is not modified. Then, a step of self-aligned silicidation is performed, for optimizing the conductivity of the components integrated on the wafer 10 (see FIGS. 13 and 14). In particular, on the wafer 10 a metal layer is deposited 26, for example, of titanium, which coats the delimiters 20, the spacers 25, and the isolating structures 17. On top of the active area 15, the metal layer 26 is in contact with the polysilicon of the delimiters 20 and with the silicon dioxide of the spacers 25. The resistor 21 and the peripheral wells 22 are, instead, separated from the metal layer 26 by the spacers 25.

The wafer 10 then undergoes thermal treatment. In this step, the portions of the metal layer 26 that coat the delimiters 20 react with the underlying polysilicon and form conductive silicide regions 26, self-aligned with respect to the delimiters 20. Elsewhere, the metal layer 26 is deposited on silicon-dioxide portions and remains substantially unaltered. Furthermore, the spacers 25 protect the resistor 21 from contact with the metal layer 26: in this way, there is prevented, in particular, silicidation of the resistor 21, which is not damaged.

By a selective etch, the portion of the metal layer 26 that has remained after thermal treatment is removed, while the conductive regions 27 are not affected. At the end of the etch, therefore, the spacers 25 and the isolating structures 17 are once again exposed.

Finally, the process of fabrication of the resistor 21 is completed by the making of contacts 28. In particular, through the internal spacers 25, first, openings 30 are made, in the proximity of opposite ends of the resistor 21. Then, metal paths are deposited and shaped so as to enable contacting of the resistor by means of the contacts 28.

The process according to the invention is advantageous in that it enables, in a simple way, integration of the resistors inside the active areas even when silicidation steps are envisaged, without having to envisage additional processing steps. In particular, there is overcome the need to make a mask dedicated exclusively to protection of the resistors during the silicidation process. In fact, the processing steps required for making both the delimiters 20 and the spacers 25 are in any case necessary for making a large number of devices in which the resistors can be integrated. For instance, the process may be adopted, in a particularly advantageous way, in the fabrication of memory devices, both volatile and non-volatile. In both cases, in fact, the deposition and definition of one or more layers of polysilicon and the formation of the spacers are envisaged. Indeed, non-volatile memory cells of an EPROM, EEPROM or Flash type also have an additional floating-gate terminal set between the substrate and the control terminal, which is also made of polysilicon. In this case, therefore, it is necessary to deposit and define two polysilicon layers, and the delimiters can be formed indifferently during formation of the control terminals or formation of the floating-gate terminals. As far as the spacers are concerned, instead, these are normally made prior to carrying-out of a heavy ion implantation for forming highly doped regions and for separating the silicidized regions of active area and polysilicon. For example, the spacers are commonly used in the fabrication of transistors. The process can, in any case, be employed in the fabrication of devices other than memories.

The operations envisaged by the present process for protecting the resistors from silicidation are shared by processes for the fabrication of other devices integrated in the same semiconductor wafer, are performed at the same time, and consequently do not involve any added burden whether from the standpoint of complexity or from the cost point of view. As compared with traditional processes, therefore, the process according to the invention is more compatible with processes for the fabrication of other integrated devices and is simpler and less costly.

Finally, it is clear that modifications and variations may be made to the device described herein, without thereby departing from the scope of the present invention.

In particular, using the process described herein, it is possible to make resistors that are dual with respect to what has been illustrated. For instance, in an N-type substrate, it is possible to make P-type resistors. Furthermore, it is possible to make resistors having shapes other than the ones illustrated, for example, serpentine resistors. Of course, in this case, also the delimiters will be different from the ones previously illustrated. In particular, in order to make serpentine resistors, the delimiters could have, in plan view, a comb-like shape with comb-fingered teeth. The dielectric layer deposited for making the spacers must, in any case, have a thickness greater than one half of the distance between the portions of the delimiters that face one another.

The delimiters, the spacers, and the metal layer could then be made of materials other than the ones previously indicated. In particular, should the process envisage deposition of an appropriate layer of material having the necessary characteristics of compatibility with the etch of the spacers (for instance, silicon nitride in the case of silicon-dioxide spacers, or vice versa), the delimiters could be made using this layer. In addition, the metal layer could be cobalt or nickel, and the spacers may be made of any material whatsoever that does not react with the metal layer during the silicidation step.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for the fabrication of integrated resistive elements with protection from silicidation, comprising:
   defining at least one active area in a semiconductor substrate;
   forming at least one resistive region having a pre-set resistivity in said active area, said at least one resistive region having first and second ends;
   forming a delimitation structure that delimits said at least one resistive region on top of said active area, said delimitation structure defining a width of said at least one resistive region between said first and second ends; and
   providing silicidation protective elements which extend within said delimitation structure and cover said at least one resistive region;
   siliciding said delimitation structure without affecting said pre-set resistivity; and
   forming contacts at said first and second ends of said at least one resistive region.

2. The process of claim 1, wherein forming said delimitation structure comprises making delimiters having portions set facing one another.

3. The process of claim 2, wherein forming said at least one resistive region comprises implantation of a dopant species in said active area between said delimiters.

4. The process of claim 1, wherein making protective elements comprises:
   depositing a dielectric layer covering said delimitation structure and said at least one resistive region; and
   anisotropically etching said dielectric layer.

5. The process of claim 4, wherein, during anisotropically etching, said dielectric layer is completely removed above said delimitation structure and is partially removed above said at least one resistive region.

6. The process of claim 4, wherein said dielectric layer has a thickness of at least one half of a distance between opposed delimiters defining the delimiting structure.

7. The process of claim 6, wherein said delimiters have a height of approximately one half of said distance.

8. The process of claim 4, wherein said dielectric layer is made of a material selected in the group consisting of: silicon dioxide, silicon nitride, and silicon oxynitride.

9. The process of claim 1, wherein said delimitation structure is made of polysilicon.

10. The process of claim 1, wherein forming said delimitation structure precedes forming said at least one resistive region.

11. A process for integrated circuit fabrication, comprising:
   defining an active area in a semiconductor substrate;
   forming a resistive region having a pre-set resistivity in the active area;
   forming a polysilicon structure which delimits the resistive region, said polysilicon structure defining a width of said resistive region between first and second ends of said resistive region;
   depositing a protective layer over the polysilicon structure and resistive region;

etching the protective layer back to expose the polysilicon structure without uncovering the resistive region;

siliciding the exposed polysilicon structure without affecting the pre-set resistivity; and forming opposed contacts at said first and second ends of said resistive region.

12. The process of claim 11, wherein forming the polysilicon structure comprises making opposed delimiters having portions set facing one another.

13. The process of claim 12, wherein forming said resistive region comprises implantation of a dopant species in said active area between said delimiters.

14. The process of claim 11, wherein the protective layer is a dielectric layer and the etching is anisotropic.

15. The process of claim 11, wherein the etching of the protective layer completely removes the layer above the polysilicon structure and partially removes the layer above the resistive region.

16. The process of claim 11, wherein the protective layer has a thickness of at least one half of a distance between opposed delimiters defining the polysilicon structure.

17. The process of claim 16, wherein the opposed delimiters each have a height of approximately one half of said distance.

18. A process for integrated circuit fabrication, comprising:

defining a non-transistor active area in a semiconductor substrate;

forming a resistive region having a pre-set resistivity in the active area;

forming a non-gate associated polysilicon structure which delimits the resistive region;

depositing a protective layer over the polysilicon structure and resistive region;

etching the protective layer back to expose the polysilicon structure without uncovering the resistive region; and siliciding the exposed polysilicon structure without affecting the pre-set resistivity.

19. The process of claim 18, further comprising forming a pair of opposed contacts at first and second ends of the resistive region so as to define a resistor structure therebetween.

20. The process of claim 1, wherein said at least one resistive region comprises at least one discrete resistor.

21. The process of claim 1, further comprising forming at least one transistor in said semiconductor substrate.

22. The process of claim 1, further comprising forming at least one memory cell in said semiconductor substrate.

23. The process of claim 11, wherein said forming said delimitation structure comprises forming a first portion of the delimitation structure at a first side of said at least one resistive region and forming a second portion of the delimitation structure at a second side of said at least one resistive region.

24. The process of claim 23, wherein the distance between the first side and the second side define the width of said at least one resistive region, and wherein the distance between said first end and the second end define a length of said at least one resistive region.

25. The process of claim 1, wherein said delimitation structure comprises polysilicon.

26. The process of claim 1, wherein said providing the silicidation protective elements includes providing said silicidation protective elements over said delimitation structure.

27. The process of claim 26, further comprising etching said silicidation protective elements back to expose said polysilicon structure without uncovering said resistive region.

28. The process of claim 1, wherein said siliciding said exposed polysilicon structure without affecting said pre-set resistivity comprises siliciding said exposed polysilicon structure without electrically contacting said at least one resistive region.

* * * * *